United States Patent
Gupta et al.

(10) Patent No.: US 6,274,499 B1
(45) Date of Patent: Aug. 14, 2001

(54) METHOD TO AVOID COPPER CONTAMINATION DURING COPPER ETCHING AND CMP

(75) Inventors: Subhash Gupta; Paul Kwok Keung Ho; Mei Sheng Zhou; Ramasamy Chockalingam, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/442,493

(22) Filed: Nov. 19, 1999

(51) Int. Cl.$^7$ .................. H01L 21/302; H01L 21/311
(52) U.S. Cl. ................ 438/692; 438/699; 438/720
(58) Field of Search .................................. 438/692, 699, 438/720

(56) References Cited

U.S. PATENT DOCUMENTS

| | | |
|---|---|---|
| 5,200,032 | 4/1993 | Shinohara ........................ 156/664 |
| 5,240,559 | 8/1993 | Ishida ................................ 456/666 |
| 5,451,551 | 9/1995 | Krishnan et al. .................. 437/241 |
| 5,470,789 | 11/1995 | Misawa ............................ 437/190 |
| 5,578,166 | 11/1996 | Hirota ............................ 156/643.1 |
| 5,591,302 | 1/1997 | Shinohara et al. ............. 156/661.11 |
| 5,693,563 | 12/1997 | Teong .............................. 437/190 |
| 5,744,376 | 4/1998 | Chan et al. ...................... 437/190 |
| 5,766,974 | 6/1998 | Sardella et al. .................. 437/195 |
| 5,783,483 | 7/1998 | Gardner .......................... 438/627 |
| 5,818,110 | 10/1998 | Cronin ............................ 257/775 |
| 5,827,436 | 10/1998 | Kamide et al. .................... 216/77 |
| 6,114,242 | * 9/2000 | Gupta et al. ...................... 438/687 |

* cited by examiner

Primary Examiner—Benjamin L. Utech
Assistant Examiner—Lynette T. Umez-Eronini
(74) Attorney, Agent, or Firm—George O. Saile; Rosemary L. S. Pil

(57) ABSTRACT

In accordance with the objects of this invention a new method to prevent copper contamination of the intermetal dielectric layer during etching, CMP, or post-etching and post-CMP cleaning by forming a dielectric cap for isolation of the underlying dielectric layer is described. In one embodiment of the invention, a dielectric layer is provided overlying a semiconductor substrate. A dielectric cap layer is deposited overlying the dielectric layer. A via is patterned and filled with a metal layer and planarized. A copper layer is deposited overlying the planarized metal layer and dielectric cap layer. The copper layer is etched to form a copper line wherein the dielectric cap layer prevents copper contamination of the dielectric layer during etching and cleaning. In another embodiment of the invention, a dielectric layer is provided overlying a semiconductor substrate. A dielectric cap layer is deposited overlying the dielectric layer. A dual damascene opening is formed through the dielectric cap layer and the dielectric layer. A copper layer is deposited overlying a barrier metal layer over the dielectric cap layer and filling the dual damascene opening. The copper layer is polished back to leave the copper layer only within the dual damascene opening where the dielectric cap layer prevents copper contamination of the dielectric layer during polishing and cleaning.

30 Claims, 8 Drawing Sheets

METHOD TO AVOID COPPER CONTAMINATION DURING COPPER ETCHING AND CMP

BACKGROUND OF THE INVENTION (1) Field of the Invention

The invention relates to a method of metallization in the fabrication of integrated circuits, and more particularly, to a method of avoiding contamination in copper metallization in the manufacture of integrated circuits.

(2) Description of the Prior Art

Copper metallization has become a future trend in integrated circuit manufacturing. However, copper contamination of the intermetal dielectric layer is a problem. Copper is a very dangerous contaminant and diffuses very quickly into silicon oxide, the most common material for interlevel dielectric (ILD) and intermetal dielectric (IMD). The application of a barrier layer underlying copper has effectively prevented the copper from making contact to the ILD or IMD layers during metallization. However, exposure of the IMD and ILD layers to copper during etching, chemical mechanical polishing (CMP), cleaning, and other processes is inevitable. This poses a threat for copper contamination control.

For example, when a copper layer 24 and barrier layer 22 over an oxide layer 14 are patterned, as shown in FIG. 1, copper ions 25 will penetrate the oxide layer 14. Likewise, when a damascene or dual damascene process is used, as shown in FIG. 2, the copper 26 is typically polished using chemical mechanical polishing (CMP). Some of the copper may "smear" 27 onto the oxide 14 causing contamination. It is desired to prevent copper contamination during processing, including etching and CMP.

A number of patents address the damascene process. U.S. Pat. No. 5,451,551 to Krishnan et al teaches a method of forming a titanium tungsten cap over copper and polishing away the excess capping layer. U.S. Pat. No. 5,470,789 to Misawa shows a titanium nitride layer that is buff-abraded. U.S. Pat. No. 5,693,563 to Teong shows a barrier layer for copper, but the copper metallization is not recessed. U.S. Pat. No. 5,744,376 to Chan et al discloses a capping layer over a non-recessed copper metallization. U.S. Pat. No. 5,818,110 to Cronin shows a damascene process with an etch stop layer over metal plugs.

Other patents teach etching of metal layers. U.S. Pat. No. 5,766,974 to Sardella et al shows a SiON etch stop layer under a metal layer. U.S. Pat. No. 5,578,166 to Hirota teaches a refractory metal barrier in copper etching, but no barrier over the oxide layer. U.S. Pat. No. 5,240,559 to Ishida, U.S. Pat. No. 5,200,032 to Shinohara and U.S. Pat. No. 5,591,302 to Shinohara et al teach various RIE methods for copper, but without barrier layers over the oxide. U.S. Pat. No. 5,827,426 to Kamide et al disclose a 2-step etching of aluminum lines. U.S. Pat. No. 5,783,483 to Gardner teaches a metal oxide etch barrier under a metal layer. Gardner's barrier has a high dielectric constant and nonuniformity problems.

SUMMARY OF THE INVENTION

A principal object of the present invention is to provide an effective and very manufacturable method of copper metallization in the fabrication of integrated circuit devices.

Another object of the invention is to prevent copper contamination of the intermetal dielectric layer during etching of a copper line.

Yet another object of the invention is to prevent copper contamination of the intermetal dielectric layer during chemical mechanical polishing in a dual damascene process.

A further object of the invention is to prevent copper contamination of the intermetal dielectric layer during copper etching by forming a dielectric cap for isolation of the underlying dielectric layer.

A still further object of the invention is to prevent copper contamination of the intermetal dielectric layer during chemical mechanical polishing of copper by forming a dielectric cap for isolation of the underlying dielectric layer.

Yet another object of the invention is to prevent copper contamination of the intermetal dielectric layer during etching, chemical mechanical polishing, or cleaning of copper by forming a dielectric cap for isolation of the underlying dielectric layer.

In accordance with the objects of this invention a new method to prevent copper contamination of the intermetal dielectric layer during etching, CMP, or cleaning by forming a dielectric cap for isolation of the underlying dielectric layer is achieved. In one embodiment of the invention, a dielectric layer is provided overlying a semiconductor substrate. A dielectric cap layer is deposited overlying the dielectric layer. A via or contact opening is made through the dielectric cap layer and the dielectric layer and filled with a metal layer and planarized. A copper layer is deposited overlying the dielectric cap layer and planarized metal layer. The copper layer is etched to form a copper line wherein the dielectric cap layer prevents copper contamination of the dielectric layer during etching.

In another embodiment of the invention, a dielectric layer is provided overlying a semiconductor substrate. A dielectric cap layer is deposited overlying the dielectric layer. A dual damascene opening is formed through the dielectric cap layer and the dielectric layer. A barrier metal layer is deposited overlying the dielectric cap layer and within the dual damascene opening. A copper layer is deposited overlying the barrier metal layer and filling the dual damascene opening. The copper layer is polished back to leave the copper layer only within the dual damascene opening wherein the dielectric cap layer prevents copper contamination of the dielectric layer during polishing.

Also, in accordance with the objects of the invention in the second embodiment, the copper layer is etched to form a recess within the dual damascene opening. A second dielectric cap layer is deposited overlying the barrier metal layer and the copper within the recess. The first and second dielectric cap layers and the barrier layer are removed except over the copper within the recess wherein the second dielectric cap layer prevents copper contamination in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention provides a method for preventing contamination of an intermetal dielectric layer by copper during processing such as etching, chemical mechanical polishing, and post-etching and post-CMP cleaning. A dielectric cap layer is formed over the dielectric layer to protect the dielectric layer from copper contamination during processing. This protection will be illustrated in the case of etching a copper line with reference to FIGS. 3–4 and in the case of polishing copper in a dual damascene process with reference to FIGS. 5–8.

Figure 1:
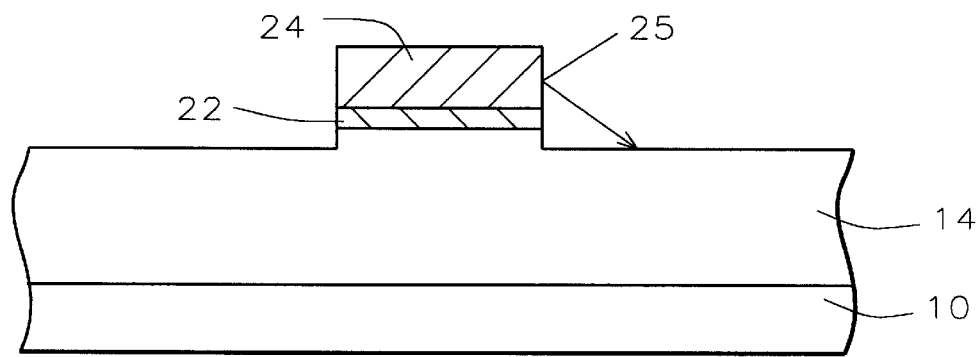
FIG. 1 schematically illustrates in cross-sectional representation copper contamination in an etching process of the prior art.
Figure 2:
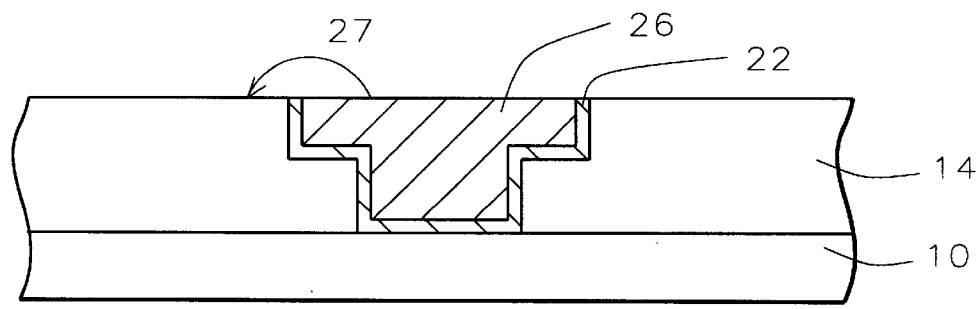
FIG. 2 schematically illustrates in cross-sectional representation copper contamination in a chemical mechanical polishing process of the prior art.
Figure 3:
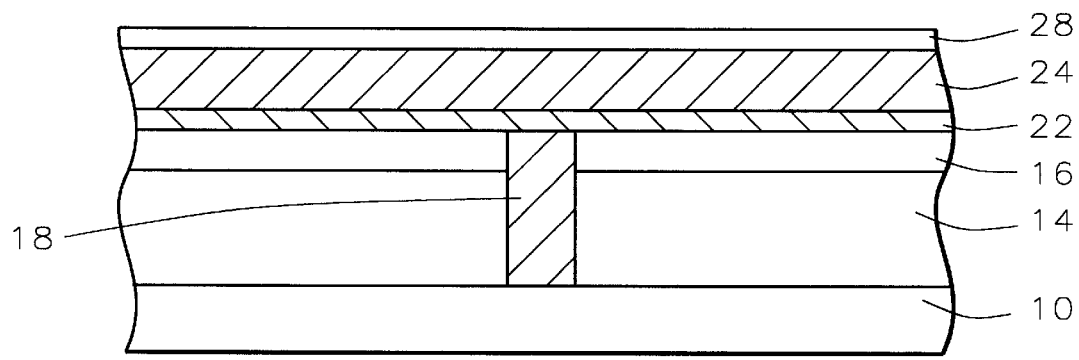
FIGS. 3 through 11 schematically illustrate in cross-sectional representation a process of the present invention.

Referring now more particularly to FIG. 3, there is illustrated a portion of a partially completed integrated circuit device. There is shown a semiconductor substrate 10, preferably composed of monocrystalline silicon. An intermetal dielectric (IMD) or interlevel dielectric (ILD) layer 14 is deposited on the substrate wafer. Semiconductor devices structures, such as gate electrodes, source and drain regions, or metal interconnects, not shown, may be formed in and on the semiconductor substrate and covered by the IMD or ILD layer 14. Layer 14 contains one or more than one layer of dielectric materials, possibly including an etch stop layer.

Now, the dielectric cap layer of the invention will be formed. A dielectric layer 16 is deposited over the surface of the IMD or ILD layer 14 to a thickness of between about 500 and 3000 Angstroms. The dielectric layer 16 may comprise silicon nitride, silicon oxynitride, silicon carbide, or a low dielectric constant material possessing the property of a copper diffusion barrier, such as, but not limited to, perfluorinated hydrocarbon polymer.

The dielectric cap layer of choice is based on device performance, manufacturability, and ease of process integration. The factors that need to be considered are film thickness uniformity, dielectric constant, etch selectivity, cleaning process compatibility, CMP compatibility, and anti-copper diffusion capability.

Typically, a via or contact masking and etching will be performed at this point and the via or contact will be filled with, for example, tungsten 18, and planarized such as by CMP. The dielectric cap layer of the invention can act as a CMP polish stop. The contact underlying the via 18 is not shown in the figures, but should be understood to be a semiconductor device structure, such as a gate electrode, source or drain region.

Next, referring to FIG. 3, a barrier metal layer 22 is deposited over the dielectric cap layer 16. Typically the barrier metal layer will comprise titanium or a titanium compound, tantalum or a tantalum compound, or tungsten or a tungsten compound, and have a thickness of between about 50 and 2000 Angstroms. A copper layer 24 is deposited over the barrier metal layer to a thickness of between about 3000 and 20,000 Angstroms. Finally, an anti-reflective coating (ARC) layer 28, such as, but not limited to, titanium nitride, silicon nitride, silicon oxynitride, and any combination of these materials, covers the copper layer to a thickness of between about 100 and 2000 Angstroms.

Figure 4:
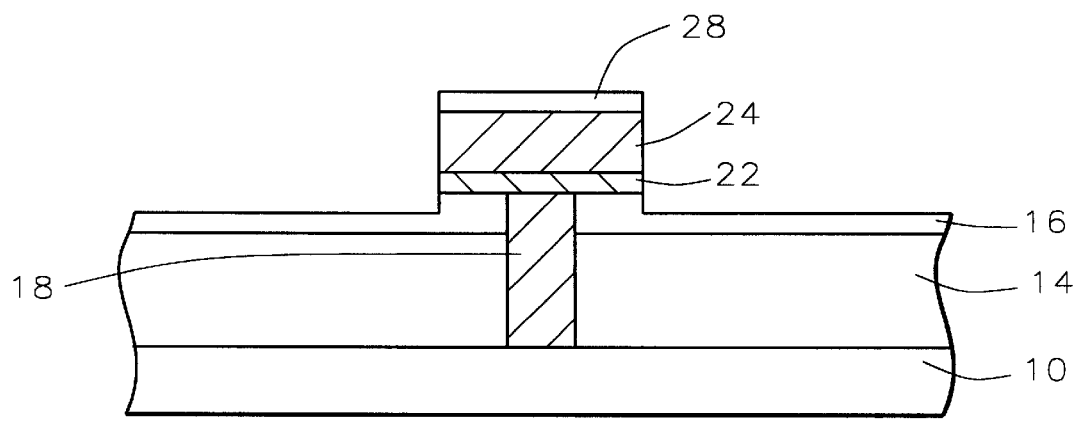

Referring now to FIG. 4, the ARC layer, the copper layer and the barrier metal layer are patterned to form copper interconnection lines. The dielectric cap layer 16 prevents contamination of the IMD/ILD layer 14 by copper during etching of the copper lines. During ashing to remove the photoresist mask, not shown, and cleaning steps, the dielectric cap continues to protect the dielectric layer 14 from copper contamination from copper or any copper containing solution.

Figure 5:
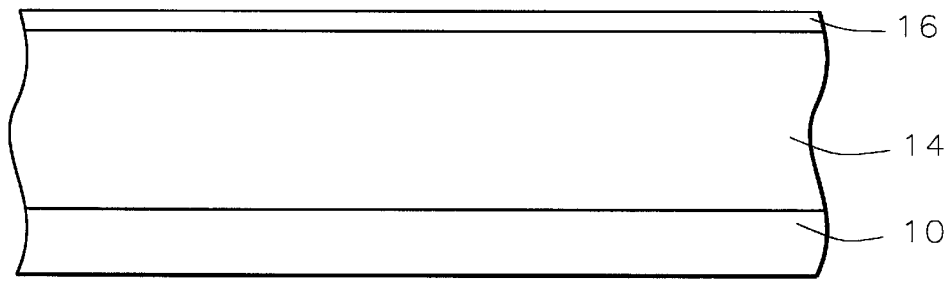

The second embodiment of the invention will now be described with reference to FIGS. 5–8. Referring now to FIG. 5, a dual damascene process will be described. An intermetal dielectric (IMD) or interlevel dielectric (ILD) layer 14 is deposited over the substrate 10. It will be understood by those skilled in the art that the IMD or ILD layer 14 may comprise multiple layers of dielectric materials and may include etch stop layers. Now, the first dielectric cap layer of the invention will be formed. A dielectric layer 16, such as silicon nitride, silicon oxynitride, silicon carbide, or a low dielectric constant material, such as, but not limited to, perfluorinated hydrocarbon polymer is deposited over the surface of the IMD or ILD layer 14 to a thickness of between about 500 and 3000 Angstroms.

Figure 6:
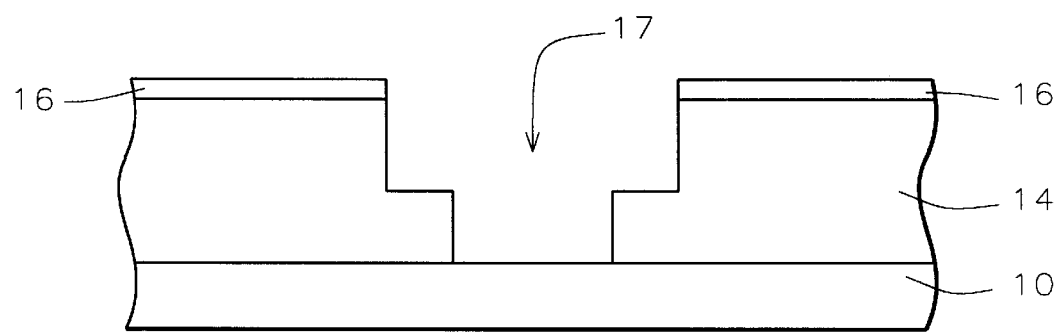

A dual damascene opening 17 is patterned into the IMD or ILD layer 14, as shown in FIG. 6. The patterning may be done by any conventional method, including via first, trench first, or embedded via. A semiconductor device structure to be contacted, not shown, may lie under the dual damascene opening.

Figure 7:
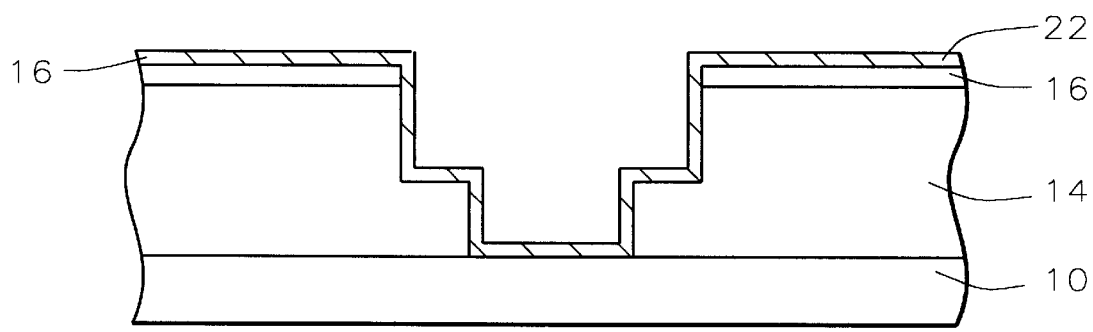

Referring now to FIG. 7, a barrier metal layer 22 is deposited over the first dielectric cap layer 16 and within the opening 17. The barrier metal layer may comprise, for example, titanium or a titanium compound, tantalum or a tantalum compound, or tungsten or a tungsten compound and may have a thickness of between about 50 and 1000 Angstroms.

Figure 8:
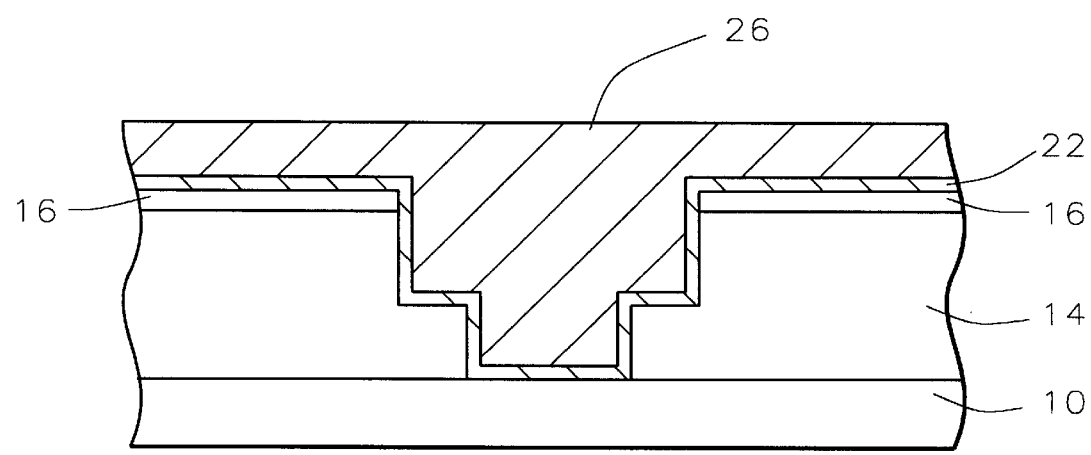

A copper layer 26 is formed over the barrier metal layer 22, as shown in FIG. 8, by any of the conventional means, including physical or chemical vapor deposition, electrochemical plating (ECP), or electroless plating, and so on.

Figure 9:
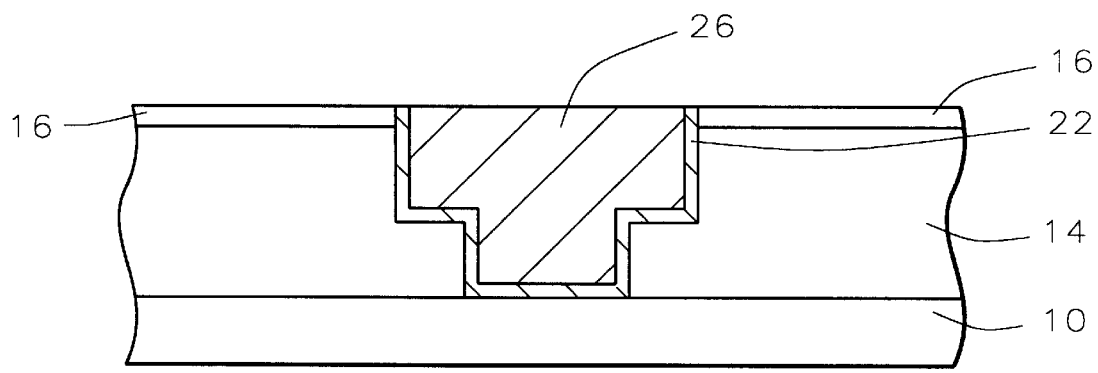

The excess copper layer over the IMD or ILD layer is polished off by chemical mechanical polishing (CMP), for example, as shown in FIG. 9. The barrier metal layer 22 is also polished away over the first dielectric cap layer 16. A portion of the first dielectric cap layer 16 is not polished away, remaining to prevent copper contamination of the IMD/ILD layer during the CMP process and subsequent cleaning and other processes.

Figure 10:
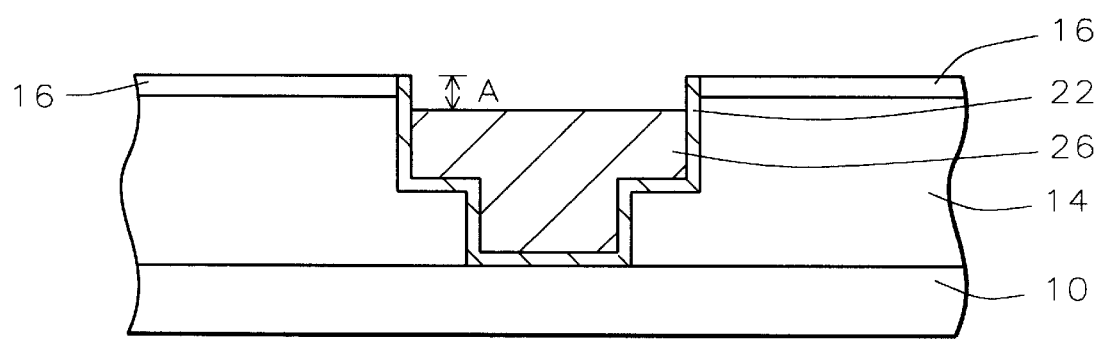
Figure 11:
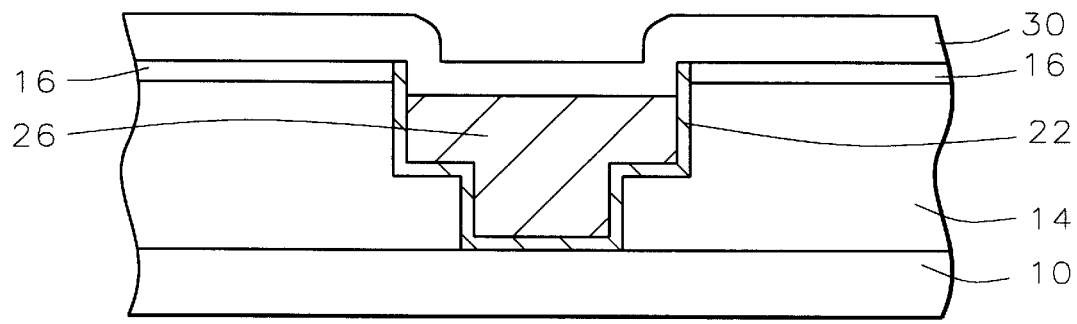

Referring now to FIG. 10 the copper 26 in the trench is partially stripped by a wet chemistry; for example, using $CH_3COOH/NH_4F$ or $CCl_4/DMSO$ chemistry, or any other chemistry, to form a recess A. This recess may have a depth of between about 500 and 2500 Angstroms for a dual damascene trench depth of between about 3000 and 20,000 Angstroms.

Now, a second cap layer is to be formed over the copper metallization 26 to fully encapsulate the copper. A second dielectric cap layer 30 is deposited over the first dielectric cap layer 16 and the copper layer 26 recessed within the trench to a thickness of between about 500 and 4000 Angstroms.

Now, the dielectric cap layer 30 is to be removed except where it covers the copper layer 26 within the trench. This may be done in one of two ways.

Figure 12:
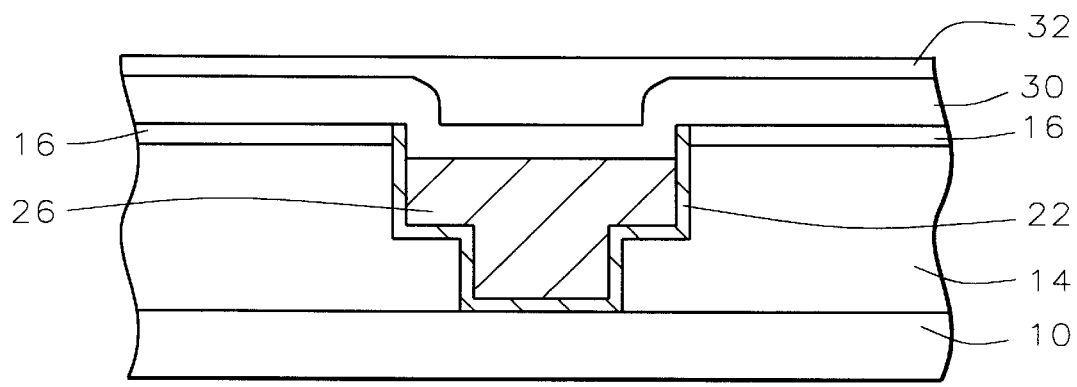
FIGS. 12 and 13 schematically illustrate in cross-sectional representation a first preferred embodiment of the present invention.

In the first alternative, a spin-on material 32 is coated over the dielectric cap layer 30 to a thickness of between about 500 and 4000 Angstroms, as illustrated in FIG. 12. This spin-on material may comprise a barrier and organic bottom and anti-reflective coating (BARC) layer, or resist, or any other suitable material that can fill in the recess and offer protection to the dielectric cap on the trench during the subsequent plasma etch.

Figure 13:
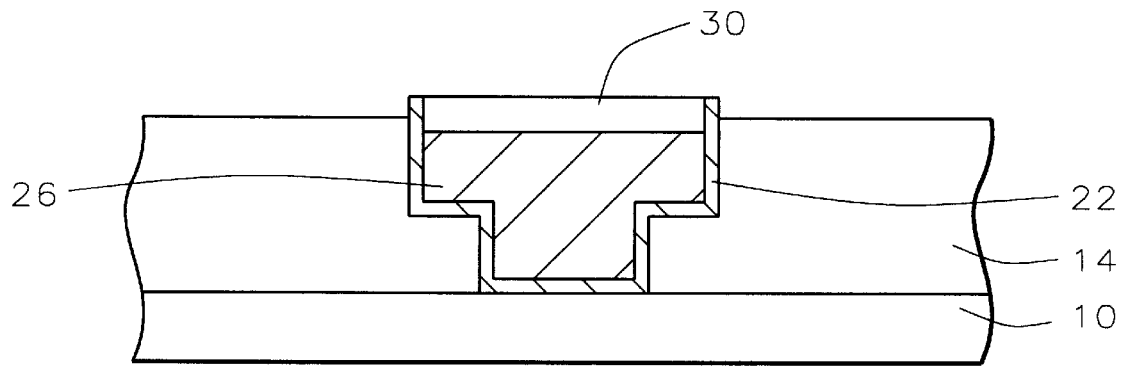

Next, as shown in FIG. 13, a blanket etch back and stripping off of the cap layer and the spin-on material is performed. The first and second dielectric caps 16 and 30 and the thin layer of spin-on material 32 above the field area are etched away by a chlorine or fluorine plasma, leaving the thicker spin-on material and second dielectric cap above the trenches. The purpose of creating the recess A, as shown in FIG. 10, becomes obvious. It is to give enough margin during the blanket etch back so that enough of the dielectric cap material 30 will remain on the trenches. After etching back, the remainder of the spin-on material 32 can be stripped off by an $O_2$ plasma or by a forming gas plasma. The removal of the first dielectric cap 16 is optional. If the dielectric cap 16 has a higher dielectric constant than the IMD/ILD, it is better to remove the cap layer 16 to reduce the effective dielectric constant of the IMD/ILD.

Figure 14:
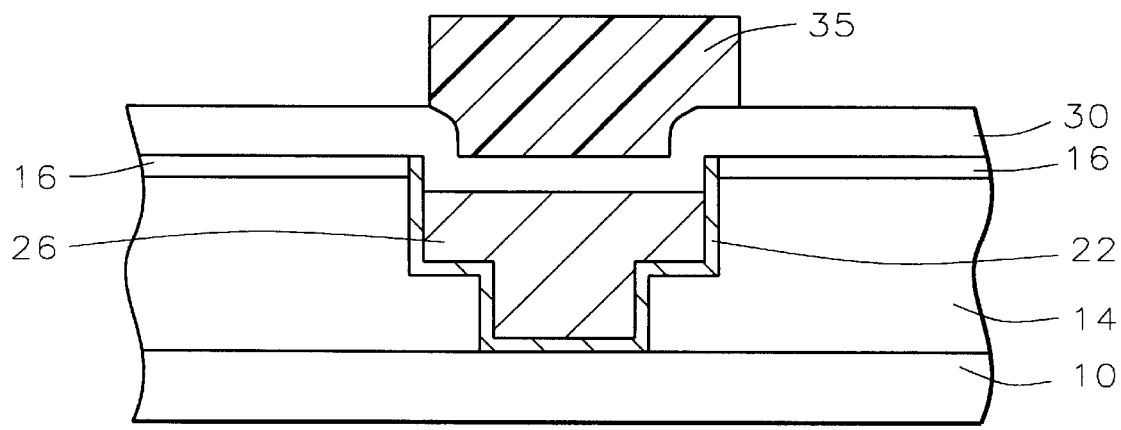
FIGS. 14 and 15 schematically illustrate in cross-sectional representation a second preferred embodiment of the present invention.
Figure 15:
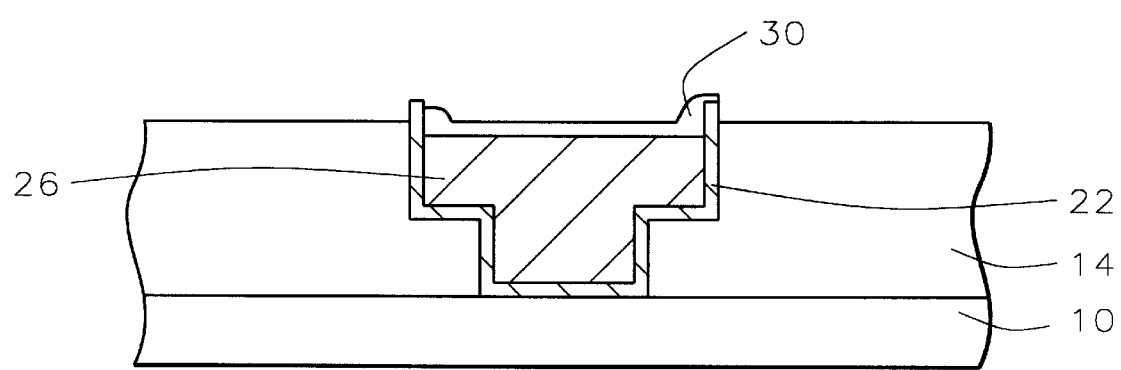

Referring now more particularly to FIGS. 14 and 15, a second alternative for removing the dielectric cap layer except where it covers the copper layer 26 within the trench is described.

Referring now to FIG. 14, a layer of photoresist is coated over the substrate and patterned to form a photomask 35, using a reverse mask or by using a reverse tone resist. The purpose of creating the recess A, as shown in FIG. 10, becomes obvious. It is to give enough margin during the overlay of the mask so that even if there is misalignment of the mask, as shown in FIG. 14, there is still enough dielectric cap material on the trenches after etch back.

As shown in FIG. 15, the first and second dielectric cap layers 16 and 30 are etched away where they are not covered by the mask 35, using a Cl or F plasma. Again, removal of the first dielectric cap layer 16 is optional. After etching, the remaining resist can be stripped off using an $O_2$ plasma or a forming gas plasma. The copper material is completely encapsulated by the barrier metal layer 22 and the dielectric cap 30.

The process of the present invention avoids copper contamination during the entire course of processing. Since the first dielectric cap layer can be removed after it is no longer needed, the overall dielectric constant can be reduced. Dishing and erosion during CMP are also reduced.

While the invention has been particularly shown and described with reference to the preferred embodiments thereof, it will be understood by those skilled in the art that various changes in form and details may be made without departing from the spirit and scope of the invention.

What is claimed is:

1. A method of preventing copper contamination of a dielectric layer during etching in the fabrication of an integrated circuit device comprising:

providing a dielectric layer overlying a semiconductor substrate;

depositing a dielectric cap layer overlying said dielectric layer;

opening a via through said dielectric cap layer and said dielectric layer;

filling said via with a metal layer and planarizing said metal layer;

depositing a copper layer overlying planarized said metal layer and said dielectric cap layer; and etching said copper layer to form a copper line wherein said dielectric cap layer prevents said copper contamination of said dielectric layer during said etching.

2. The method according to claim 1 wherein said dielectric cap layer is selected from the group consisting of silicon nitride, silicon oxynitride, silicon carbide, and low dielectric constant materials such as perfluorinated hydrocarbon polymer having a thickness of between about 500 and 3000 Angstroms.

3. The method according to claim 1 further comprising:

depositing a barrier metal layer underlying said copper layer and overlying said dielectric cap layer; and depositing an anti-reflective coating layer overlying said copper layer.

4. The method according to claim 3 wherein said step of etching said copper layer comprises etching through said anti-reflective coating layer, said copper layer, and said barrier metal layer.

5. The method according to claim 3 wherein said barrier metal layer is selected from the group consisting of titanium, titanium compounds, tantalum, tantalum compounds, tungsten, and tungsten compounds.

6. The method according to claim 1 wherein said dielectric cap layer also prevents said copper contamination of said dielectric layer during post-etching cleaning.

7. A method of preventing copper contamination of a dielectric layer during chemical mechanical polishing in the fabrication of an integrated circuit device comprising:

providing said dielectric layer overlying a semiconductor substrate;

depositing a dielectric cap layer overlying said dielectric layer;

forming a dual damascene opening through said dielectric cap layer and said dielectric layer;

depositing a barrier metal layer overlying said dielectric cap layer and within said dual damascene opening;

depositing a copper layer overlying said barrier metal layer and filling said dual damascene opening; and polishing back said copper layer to leave said copper layer only within said dual damascene opening wherein said dielectric cap layer prevents said copper contamination of said dielectric layer during said polishing.

8. The method according to claim 7 wherein said dielectric cap layer is selected from the group consisting of silicon nitride, silicon oxynitride, silicon carbide, and low dielectric constant materials such as perfluorinated hydrocarbon polymer having a thickness of between about 500 and 3000 Angstroms.

9. The method according to claim 7 wherein said barrier metal layer is selected from the group consisting of titanium, titanium compounds, tantalum, tantalum compounds, tungsten, and tungsten compounds.

10. The method according to claim 7 wherein said polishing comprises chemical mechanical polishing.

11. The method according to claim 7 wherein said dielectric cap layer also prevents said copper contamination of said dielectric layer during post-polishing cleaning.

12. A method of preventing copper contamination of a dielectric layer in the fabrication of an integrated circuit device comprising:

providing said dielectric layer overlying a semiconductor substrate;

depositing a first dielectric cap layer overlying said dielectric layer;

forming a dual damascene opening through said first dielectric cap layer and said dielectric layer;

depositing a barrier metal layer overlying said first dielectric cap layer and within said dual damascene opening;

depositing a copper layer overlying said barrier metal layer and filling said dual damascene opening;

polishing back said copper layer and said barrier metal layer to leave said copper layer and said barrier metal layer only within said dual damascene opening wherein said first dielectric cap layer prevents said copper contamination of said dielectric layer during said polishing;

etching said copper layer to form a recess within said dual damascene opening;

depositing a second dielectric cap layer overlying said barrier metal layer and said copper within said recess;

coating a spin-on material overlying said second dielectric cap layer;

etching back said spin-on material and said first and second dielectric cap layer over said dielectric layer whereby all of said first dielectric cap layer is removed; and thereafter removing all of said spin-on material leaving said second dielectric cap layer only over said copper within said recess wherein said second dielectric cap layer prevents said copper contamination in the fabrication of said integrated circuit device.

13. The method according to claim 12 wherein said first dielectric cap layer is selected from the group consisting of silicon nitride, silicon oxynitride, silicon carbide, and low dielectric constant materials such as perfluorinated hydrocarbon polymer and has a thickness of between about 500 and 3000 Angstroms.

14. The method according to claim 12 wherein said barrier metal layer is selected from the group consisting of titanium, titanium compounds, tantalum, tantalum compounds, tungsten, and tungsten compounds.

15. The method according to claim 12 wherein said first dielectric cap layer also prevents said copper contamination of said dielectric layer during post-polishing cleaning.

16. The method according to claim 12 wherein said recess is formed by a wet etch method.

17. The method according to claim 16 wherein said wet etch method comprises $CH_2COOH/NH_4F$ or $DMSO/CCl_4$ chemistry.

18. The method according to claim 12 wherein said second dielectric cap layer is selected from the group consisting of silicon nitride, silicon oxynitride, silicon carbide, and low dielectric constant materials such as perfluorinated hydrocarbon polymer and has a thickness of between about 500 and 4000 Angstroms.

19. The method according to claim 12 wherein said spin-on material is deposited to a thickness of between about 500 and 4000 Angstroms.

20. The method according to claim 12 wherein said step of etching back said spin-on material and said first and second dielectric cap layers over said dielectric layer comprises a Cl or F plasma etch.

21. The method according to claim 12 wherein said step of removing said spin-on material comprises stripping in an $O_2$ plasma or forming gas plasma.

22. A method of preventing copper contamination of a dielectric layer in the fabrication of an integrated circuit device comprising:

providing said dielectric layer overlying a semiconductor substrate;

depositing a first dielectric cap layer overlying said dielectric layer;

forming a dual damascene opening through said first dielectric cap layer and said dielectric layer;

depositing a barrier metal layer overlying said first dielectric cap layer and within said dual damascene opening;

depositing a copper layer overlying said barrier metal layer and filling said dual damascene opening;

polishing back said copper layer and said barrier metal layer to leave said copper layer and said barrier metal layer only within said dual damascene opening wherein said first dielectric cap layer prevents said copper contamination of said dielectric layer during said polishing;

etching said copper layer to form a recess within said dual damascene opening;

depositing a second dielectric cap layer overlying said barrier metal layer and said copper within said recess;

forming a mask over said dual damascene opening and etching away said first and second dielectric cap layers where they are not covered by said mask; and thereafter removing said mask leaving said second dielectric cap layer only over said copper within said recess wherein said second dielectric cap layer prevents said copper contamination in the fabrication of said integrated circuit device.

23. The method according to claim 22 wherein said first dielectric cap layer is selected from the group consisting of silicon nitride, silicon oxynitride, silicon carbide, and low dielectric constant materials such as perfluorinated hydrocarbon polymer and has a thickness of between about 500 and 3000 Angstroms.

24. The method according to claim 22 wherein said barrier metal layer is selected from the group consisting of titanium, titanium compounds, tantalum, tantalum compounds, tungsten, and tungsten compounds.

25. The method according to claim 22 wherein said first dielectric cap layer also prevents said copper contamination of said dielectric layer during post-polishing cleaning.

26. The method according to claim 22 wherein said recess is formed by a wet etch method.

27. The method according to claim 26 wherein said wet etch method comprises $CH_2COOH/NH_4F$ or $DMSO/CCl_4$ chemistry.

28. The method according to claim 22 wherein said second dielectric cap layer is selected from the group consisting of silicon nitride, silicon oxynitride, silicon carbide, and low dielectric constant materials such as perfluorinated hydrocarbon polymer and has a thickness of between about 500 and 4000 Angstroms.

29. The method according to claim 22 wherein said step of forming said mask comprises using a reverse of a mask used to form said dual damascene opening.

30. The method according to claim 22 wherein said step of forming said mask comprises using a mask used to form said dual damascene opening and a reverse tone resist.

* * * * *